Figure 1:
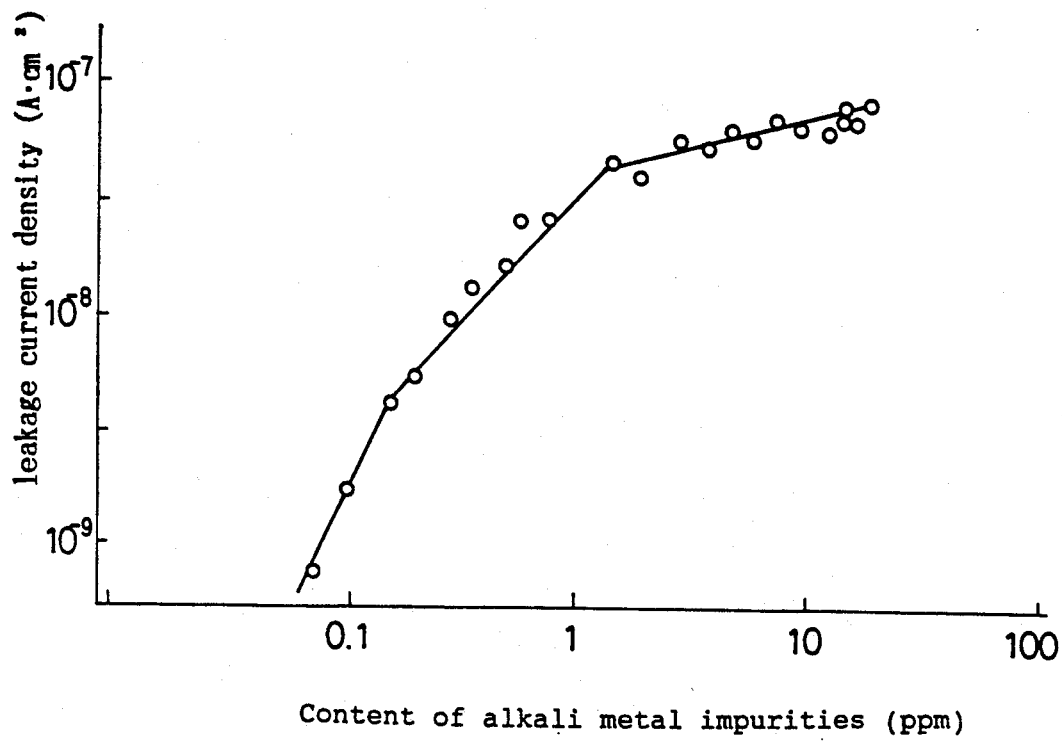

United States Patent [19]

Ogi et al.

[11] Patent Number: 5,244,742

[45] Date of Patent: Sep. 14, 1993

[54] ULTRAHIGH-PURITY FERROELECTRIC THIN FILM

[75] Inventors: Katsumi Ogi; Nobuyuki Soyama, both of Omiya, Japan

[73] Assignee: Mitsubishi Materials Corporation, Tokyo, Japan

[21] Appl. No.: 791,998

[22] Filed: Nov. 14, 1991

[30] Foreign Application Priority Data

Nov. 16, 1990 [JP] Japan .................. 2-310890

[51] Int. Cl.$^5$ ............................. B32B 18/00
[52] U.S. Cl. .................... 428/469; 428/472; 428/472.1; 428/697; 428/701; 428/702; 252/62.9; 252/519
[58] Field of Search ............... 428/469, 472, 697, 701, 428/702, 472.1; 252/62.9, 519, 520

[56] References Cited

U.S. PATENT DOCUMENTS

| | | | |
|---|---|---|---|
| 3,303,133 | 2/1967 | Bratschun | 252/62.9 |
| 3,816,750 | 6/1974 | Liu | 252/62.9 |
| 3,917,780 | 11/1975 | Mazdiyasni | 252/62.9 |
| 3,997,690 | 12/1976 | Chen | 252/62.9 |
| 4,963,390 | 10/1990 | Lipeles et al. | 427/110 |

Primary Examiner—Ellis P. Robinson
Assistant Examiner—Timothy M. Speer
Attorney, Agent, or Firm—Webb, Burden, Ziesenheim & Webb

[57] ABSTRACT

Disclosed herein is an ultrahigh-purity ferroelectric thin film of Pb-containing ferroelectric represented by the formula $Pb_{1-x}La_x(Zr_yTi_{1-y})_{1-x/4}O_3$ (where Y is 0 or 1 or a decimal smaller than 1), characterized in that the total content of alkali metal impurities therein is less than 1 ppm, or characterized in that the total content of alkali metal impurities therein is less than 0.1 ppm and the total content of U and Th therein is less than 10 ppb. It will find use as infrared sensor, piezoelectric filter, vibrator, laser modulator, optical shutter, capacitor film, nonvolatile memory, etc. owing to its very low level of leakage current.

5 Claims, 1 Drawing Sheet

Content of alkali metal impurities (ppm)

ULTRAHIGH-PURITY FERROELECTRIC THIN FILM

BACKGROUND OF THE INVENTION

1. Field of the Invention

The present invention relates to an ultrahigh-purity ferroelectric thin film, more particularly, to an ultrahigh-purity ferroelectric thin film that can be used for infrared sensor, piezoelectric filter, vibrator, laser modulator, optical shutter, capacitor film, nonvolatile memory, etc.

2. Description of the Prior Art

Ferroelectric thin films need heat treatment to increase crystallinity in the final stage of their forming process so that they have good characteristic properties, no matter what the process is. This conventional practice poses a problem because increased crystallinity is accompanied by the growth of crystal grains which leads to an increased leakage current that flows through grain boundaries. This problem prevents ferroelectric thin films from being improved further in their characteristic properties.

The foregoing holds true of ferroelectric thin film of Pb-containing perovskite type. It also needs heat treatment to increase crystallinity for its enhanced ferroelectricity. As crystal grains grow during heat treatment, impurities separate out at the grain boundaries to permit more leakage current to flow through them. It is conceivable that leakage current will decrease if impurities are removed. However, this idea is not practicable because it is difficult to purify Pb, La, Ti, Zr, etc. which constitute the ferroelectric thin film. In fact, it is very difficult to lower the content of their impurities below 0.1 ppm. Incidentally, as far as Pb-containing ferroelectric thin film is concerned, no one has reported that its characteristic properties are improved by purification.

DISCLOSURE OF THE INVENTION

The present inventors attempted to extremely purify the metal components of ferroelectric thin film. Purification was performed on each metal component in the form of organometallic compound capable of repeated distillation, sublimation, and recrystallization (or combination thereof). Purified raw materials were made into Pb-containing ferroelectric thin film of lead titanate (PT), lead titanate zirconate (PZT), or lanthanum-containing lead titanate zirconate (PLZT). The ferroelectric thin film was tested to investigate the relationship between impurity content and leakage current. It was found that leakage current greatly decreases when the total amount of alkali metal impurities is less than 1 ppm, preferably less than 0.1 ppm. This finding led to the present invention, which is embodied in Pb-containing ferroelectric thin film having improved ferroelectricity owing to the significant decrease in leakage current which is achieved by reducing the total content of alkali metal impurities below 1 ppm, preferably below 0.1 ppm.

It is an object of the present invention to provide a ferroelectric thin film of Pb-containing ferroelectric represented by the formula $Pb_{1-x}La_x(Zr_yTi_{1-y})_{1-x/4}O_3$ (where Y is 0 or 1 or a decimal smaller than 1), characterized in that the total content of alkali metal impurities therein is less than 1 ppm, preferably less than 0.1 ppm.

It is another object of the present invention to provide a ferroelectric thin film of Pb-containing ferroelectric represented by the formula $Pb_{1-x}La_x(Zr_yTi_{1-y})_{1-x/4}O_3$ (where Y is 0 or 1 or a decimal smaller than 1), characterized in that the total content of alkali metal impurities therein is less than 1 ppm, preferably less than 0.1 ppm, and the total content of U and Th therein is less than 10 ppb.

To be more specific, the present invention provides a Pb-containing ferroelectric thin film of lead titanate (represented by the above formula where $x=y=0$), lead titanate zirconate (represented by the above formula where $x=0$ and $0<y<1$), or La-containing lead titanate zirconate (represented by the above formula where $x>0$ and $y<1$), in which the total content of alkali metal impurities is less than 1 ppm, preferably less than 0.1 ppm, and the total content of U and Th is less than 10 ppb.

The ferroelectric thin film of the present invention is produced from the organometallic compounds corresponding to metal components constituting the thin film, which have been extremely purified by repeating distillation, sublimation, and recrystallization, individually or in combination. To form the ferroelectric thin film, the purified organometallic compounds are dissolved in an organic solvent according to a desired composition, and the solution is applied to a substrate, followed by drying and firing. Alternatively, the purified organometallic compounds are converted into metal oxide powders to be applied to a substrate by sputtering.

The production of the ferroelectric thin film of the present invention starts with the preparation of a solvent solution containing organometallic compounds of lead, lanthanum, titanium, and zirconium, in which each metal is bonded to an organic group through oxygen. The solvent solution is subsequently mixed with a stabilizer and diluted with a prescribed amount of water for partial hydrolysis to form the metal-oxygen-metal bond in the solution. Examples of the stabilizer include β-diketones, ketonic acids, keto esters, hydroxy acids, higher carboxylic acids, and amines. They should be added in an amount of 0.2–3 mol per mol of all metals.

The solution mentioned above provides a uniform ferroelectric thin film without a likelihood that the constituting elements (such as lead) or compounds thereof volatilize during firing. Moreover, the resulting thin film easily undergoes transition into perovskite-type crystal of ferroelectric phase.

To investigate the relationship between leakage current and impurities content, samples of ferroelectric thin film were prepared in the following manner. First, commercial organometallic compounds of Pb, Zr, and Ti were purified by repeated distillation, sublimation, and recrystallization to give purified organometallic compounds which vary in impurities content. They were dissolved in an organic solvent so that the metals were present in an atomic ratio of $Pb:Zr:Ti=1:0.52:0.48$. The solution was properly diluted until the concentration reached 10 wt % in terms of $PbZr_{0.52}Ti_{0.48}O_3$. The thus prepared coating solution for PZT film was applied to a platinum substrate by spin coating to form an approximately 3000 Å thick film, which was subsequently fired in the air at 700° C. for 2 hours. The film was provided with platinum electrodes to measure the leakage current density. The results are shown in FIG. 1. (Each value represents an average of 20 measurements.) It is apparently noted from FIG. 1 that the leakage current density sharply decreases as the total amount of metal impurities decreases below 1 ppm. Moreover, the leakage current density is extremely low when the total amount of metal impurities is less than 0.1 ppm.

It was confirmed that the metal impurities are mainly alkali metals. Since alkali metals are closely associated with charge transfer and liable to cause leakage current upon deposition in grain boundaries, it is essential in this invention that the total content of alkali metal impurities (such as Li, Na, and K) should be lower than 1 ppm, preferably lower than 0.1 ppm. A decrease in the content of alkali metal impurities leads to a decrease in the amount of impurities in grain boundaries and hence to a decrease in film defects. This is a conceivable reason for the sharp decrease in leakage current.

According to the present invention, the total content of U and Th should be less than 10 ppb, because U and Th generate α-rays which cause soft errors when the ferroelectric thin film is used as the capacitor film of DRAM.

As mentioned above, the present invention provides an ultrahigh-purity ferroelectric thin film which exhibits outstanding dielectric properties with a greatly decreased leakage current and also exhibits characteristic properties which vary very little from one part of the thin film to another. It will find use in the wide application area of electronics.

BRIEF EXPLANATION OF THE ATTACHED DRAWING

FIG. 1 is a graph showing the relationship between the leakage current density and the content of alkali impurities in a thin film of lead titanate zirconate (PZT).

EXAMPLE 1

Organometallic compounds of Pb, Zr, and Ti were purified by repeating distillation, sublimation, and recrystallization. They were dissolved in an organic solvent so that the metals were present in an atomic ratio of Pb:Zr:Ti=1:0.52:0.48. The solution was properly diluted until the concentration reached 10 wt % in terms of $PbZr_{0.52}Ti_{0.48}O_3$. Thus there was obtained a coating solution for PZT film. This coating solution gave oxides which contain alkali metal impurities (Na, K, and Li) in an amount less than 10 ppb each and also contain U and Th in an amount less than detection limits. The coating solution was applied to a platinum substrate by spin coating to form an approximately 3000 Å thick film, which was subsequently fired in the air at 700° C. for 2 hours. The film was provided with platinum electrodes to measure electric properties. The results are shown below.

| Permitivity ($\epsilon$) | Dielectric loss (tan δ) | Leakage current density at 5V (A/cm$^2$) | Breakdown voltage (KV/cm) |
|---|---|---|---|
| 928 | 0.02 | $8.2 \times 10^{-10}$ | 892 |

EXAMPLE 2

Organometallic compounds of Pb and Ti, which had been purified in the same manner as in Example 1, were dissolved in an organic solvent so that the metals were present in an atomic ratio of Pb:Ti=1:1. The solution was properly diluted until the concentration reached 10 wt % in terms of $PbTiO_3$. Thus there was obtained a coating solution for PT film. This coating solution gave oxides which contain alkali metal impurities (Na, K, and Li) in an amount less than 10 ppb each and also contain U and Th in an amount less than detection limits. The coating solution was applied to a platinum substrate by spin coating to form an approximately 3000 Å thick film, which was subsequently fired in the air at 700° C. for 2 hours. The film was provided with platinum electrodes to measure the electric properties. The results are shown below.

| Permitivity ($\epsilon$) | Dielectric loss (tan δ) | Leakage current density at 5V (A/cm$^2$) | Breakdown voltage (KV/cm) |
|---|---|---|---|
| 174 | 0.06 | $6.8 \times 10^{-10}$ | 816 |

EXAMPLE 3

Organometallic compounds of Pb, La, Zr, and Ti, which had been purified in the same manner as in Example 1, were dissolved in an organic solvent so that the metals were present in an atomic ratio of Pb:La:Zr:Ti=0.91:0.09:0.64:0.34. The solution was properly diluted until the concentration reached 10 wt % in terms of $Pb_{0.91}La_{0.09}(Zr_{0.65}Ti_{0.35})_{0.9775}O_3$. Thus there was obtained a coating solution for PZT film. This coating solution gave oxides which contain alkali metal impurities (Na, K, and Li) in an amount less than 10 ppb each and also contain U and Th in an amount less than detection limits. The coating solution was applied to a platinum substrate by spin coating to form an approximately 3000 Å thick film, which was subsequently fired in the air at 700° C. for 2 hours. The film was provided with platinum electrodes to measure the electric properties. The results are shown below.

| Permitivity ($\epsilon$) | Dielectric loss (tan δ) | Leakage current density at 5V (A/cm$^2$) | Breakdown voltage (KV/cm) |
|---|---|---|---|
| 965 | 0.03 | $3.4 \times 10^{-10}$ | 872 |

EXAMPLE 4

Organometallic compounds of Pb, Zr, and Ti, which had been purified in the same manner as in Example 1, were made into PbO, ZrO, and $TiO_2$ powders. The powders were mixed so that the metals were present in an atomic ratio of Pb:Zr:Ti=1:0.52:0.48. The powder mixture was sintered to form a sputtering target. The content of impurities in the target was the same as that in Example 1. Sputtering with this target was performed to form on a platinum substrate an approximately 3000 Å thick film, which was subsequently fired in the air at 700° C. for 2 hours. The film was provided with platinum electrodes to measure the electric properties. The results are shown below.

| Permitivity ($\epsilon$) | Dielectric loss (tan δ) | Leakage current density at 5V (A/cm$^2$) | Breakdown voltage (KV/cm) |
|---|---|---|---|
| 785 | 0.02 | $5.7 \times 10^{-10}$ | 823 |

EXAMPLE 5

Organometallic compounds of Pb and Ti, which had been purified in the same manner as in Example 1, were directly used to form an approximately 3000 Å thick PbTiO$_3$ thin film on a platinum substrate by the CVD method. The deposited film was fired in the air at 700° C. for 2 hours. Incidentally, the organometallic compounds gave oxides which contain alkali metal impurities (Na, K, and Li) in an amount less than 10 ppb each and also contain U and Th in an amount less than detection limits. The film was provided with platinum electrodes to measure the electric properties. The results are shown below.

| Permitivity ($\epsilon$) | Dielectric loss (tan $\delta$) | Leakage current density at 5V (A/cm$^2$) | Breakdown voltage (KV/cm) |
|---|---|---|---|
| 155 | 0.04 | 5.7 × 10$^{-10}$ | 843 |

EXAMPLE 6

Lead acetate, lanthanum acetate, and tetrabutoxyzirconium were purified in the same manner as in Example 1. The lead acetate (8.63 g) and lanthanum acetate (0.71 g) were dissolved in 2-methoxyethanol. After removal of water by azeotropic distillation with the solvent, tetraisopropoxy titanium (2.43 g) and tetrabutoxyzirconium (6.09 g) were added. Further, acetylacetone (6.83 g) as a stabilizer was added. After thorough mixing, isopropyl alcohol (54.93 g) and water (1.23 g) were added to make the total amount 80.8 g. Thus there was obtained a coating solution for ferroelectric thin film which has a concentration of 10% in terms of oxides. The content of alkali metal impurities (Na, K, and Li) in this solution was less than 10 ppb each, and U and Th were not detected. The coating solution was applied to a platinum substrate by spin coating at 3000 rpm and the coated film was dried. The spin coating and drying were repeated 6 times. Finally, the film was fired at 600° C. for 1 hour to give a PLZT thin film. This thin film was found by X-ray diffractometry to be a single-phase film of perovskite-type crystals. The film was provided with platinum electrodes to measure the electric properties. It gave a permitivity ($\epsilon$) of 905 and a leakage current density of 7.3 × 10$^{-10}$ A/cm$^2$.

What is claimed is:

1. A ferroelectric thin film of Pb-containing ferroelectric having reduced leakage current properties represented by the formula Pb$_{1-x}$La$_x$(Zr$_y$Ti$_{1-y}$)$_{1-x/4}$O$_3$ (where Y is 0 or 1 or a decimal smaller than 1), characterized in that the total content of alkali metal impurities therein is less than 1 ppm.

2. A ferroelectric thin film of Pb-containing ferroelectric having reduced leakage current properties represented by the formula Pb$_{1-x}$La$_x$(Zr$_y$Ti$_{1-y}$)$_{1-x/4}$O$_3$ (where Y is 0 or 1 or a decimal smaller than 1), characterized in that the total content of alkali metal impurities therein is less than 0.1 ppm and the total content of U and Th therein is less than 10 ppb.

3. A ferroelectric thin film as defined in claim 1 wherein the Pb-containing ferroelectric is lead titanate (represented by the above formula where x=y=0), lead titanate zirconate (represented by the above formula where x=0 and 0<y<1), or La-containing lead titanate zirconate (represented by the above formula where x>0 and y<1).

4. A ferroelectric thin film as defined in claim 1, which is formed from a coating solution prepared by the steps of dissolving organometallic compounds of lead, lanthanum, titanium, and zirconium in an organic solvent, thereby forming a solution in which each metal is bonded to an organic group through oxygen, mixing the solution with a stabilizer, and diluting the solution with a prescribed amount of water for partial hydrolysis to form the metal-oxygen-metal bond in the solution.

5. A ferroelectric thin film as defined in claim 2, wherein the Pb-containing ferroelectric is lead titanate (represented by the above formula where x=y=0), lead titanate zirconate (represented by the above formula where x=0 and 0<y<1), or La-containing lead titanate zirconate (represented by the above formula where x>0 and y<1).

* * * * *